US009233439B2

(12) United States Patent
Seo et al.

(10) Patent No.: US 9,233,439 B2
(45) Date of Patent: Jan. 12, 2016

(54) MANUFACTURING METHOD OF LIQUID-COOLED JACKET

(71) Applicant: NIPPON LIGHT METAL COMPANY, LTD., Tokyo (JP)

(72) Inventors: Nobushiro Seo, Shizuoka (JP); Shinya Makita, Shizuoka (JP); Hisashi Hori, Shizuoka (JP); Masanori Tamaishi, Tokyo (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/103,473

(22) Filed: Dec. 11, 2013

(65) Prior Publication Data
US 2014/0165399 A1 Jun. 19, 2014

Related U.S. Application Data

(63) Continuation of application No. 13/148,955, filed as application No. PCT/JP2009/070963 on Dec. 16, 2009, now Pat. No. 8,627,567.

(30) Foreign Application Priority Data

Feb. 23, 2009 (JP) ................. 2009-038808

(51) Int. Cl.
*B23P 15/26* (2006.01)
*F28F 3/12* (2006.01)
(Continued)

(52) U.S. Cl.
CPC ............ *B23P 15/26* (2013.01); *B23K 20/1265* (2013.01); *F28F 3/12* (2013.01); *H01L 23/473* (2013.01);
(Continued)

(58) Field of Classification Search
CPC .. B29C 65/06; B29C 66/349; B29C 66/3492; B23K 3/085; B23K 26/423; B23K 37/003; B23K 20/122; B23K 20/1225; B23K 20/127; B23K 20/1205; Y10T 29/4935; Y10T 29/49366; Y10T 29/49387

USPC ......... 29/890.03, 890.032, 890.038, 890.039, 29/890.04, 890.054; 156/73.5, 308.2, 156/308.4, 282, 311
See application file for complete search history.

(56) References Cited

U.S. PATENT DOCUMENTS 6,058,010 A 5/2000 Schmidt et al.
6,722,555 B2 4/2004 Ezumi et al.
(Continued)

FOREIGN PATENT DOCUMENTS

JP 10-155745 A 6/1998
JP 2001-087871 A 4/2001
(Continued)

OTHER PUBLICATIONS

Taiwanese Office Action issued in corresponding Application No. 099102833 dated Jun. 11, 2013.
(Continued)

*Primary Examiner* — Christopher Besler
(74) *Attorney, Agent, or Firm* — Squire Patton Boggs (US) LLP

(57) ABSTRACT

Provided is a method of producing a liquid-cooled jacket wherein deformation of a seal body can be minimized. A method of producing a liquid-cooled jacket constituted by fixing a seal body which seals the opening of a recess, by friction stir welding, to a jacket body having a partially opening recess through which heat transport fluid for transporting heat generated by a heat generating body to the outside flows, wherein the seal body is mounted on a supporting surface which is formed at the peripheral edge of the opening of the recess in the jacket body and consists of the bottom surface of a step lower than the surface of the jacket body, the side surface of the step of the jacket body and the outer circumferential surface of the seal body are butted each other, a plasticized region is formed by making one round of a rotary tool which is equipped with a stir pin having a length greater than the thickness of the seal body round along the butting portion of the side surface of the step of the jacket body and the outer circumferential surface of the seal body, and then the seal body is welded to the jacket body.

8 Claims, 8 Drawing Sheets

(51) Int. Cl.
 *H05K 7/20* (2006.01)
 *H01L 23/473* (2006.01)
 *B23K 20/12* (2006.01)
 *B29C 65/00* (2006.01)

(52) U.S. Cl.
 CPC ............ *H05K 7/20254* (2013.01); *B23K 20/12* (2013.01); *B23K 2201/14* (2013.01); *B29C 66/349* (2013.01); *B29C 66/3492* (2013.01); *H01L 2924/0002* (2013.01); *Y10T 29/4935* (2015.01); *Y10T 29/49826* (2015.01)

(56) References Cited

U.S. PATENT DOCUMENTS

| | | | |
|---|---|---|---|
| 8,281,977 | B2 | 10/2012 | Sato et al. |
| 8,365,408 | B2 * | 2/2013 | Seo et al. .................. 29/890.04 |
| 2001/0017763 | A1 | 8/2001 | Kaufmann |
| 2001/0047935 | A1 | 12/2001 | Enomoto et al. |
| 2002/0060238 | A1 | 5/2002 | Ezumi et al. |
| 2002/0153130 | A1 * | 10/2002 | Okamoto et al. ............. 165/170 |
| 2003/0022008 | A1 | 1/2003 | Jogan et al. |
| 2006/0096748 | A1 | 5/2006 | Okamoto et al. |
| 2006/0283544 | A1 | 12/2006 | Mori et al. |
| 2008/0099533 | A1 * | 5/2008 | Hanlon et al. ............. 228/112.1 |
| 2008/0116246 | A1 * | 5/2008 | Rigal et al. .................... 228/193 |
| 2009/0065178 | A1 | 3/2009 | Kasezawa et al. |
| 2009/0200359 | A1 | 8/2009 | Chen et al. |
| 2010/0089977 | A1 | 4/2010 | Chen et al. |
| 2010/0314075 | A1 | 12/2010 | Takahashi et al. |

FOREIGN PATENT DOCUMENTS

| | | |
|---|---|---|
| JP | 2001-313357 A | 11/2001 |
| JP | 2002207824 A | 7/2002 |
| JP | 2002-248584 A | 9/2002 |
| JP | 2004-148015 A | 5/2004 |
| JP | 2006-324647 A | 11/2006 |
| JP | 2009-268589 A | 11/2009 |
| JP | 2010240671 A | 10/2010 |
| JP | 2010264467 A | 11/2010 |
| TW | 506874 B | 10/2002 |
| TW | 200902202 A | 1/2009 |
| WO | 03/043501 A1 | 5/2003 |
| WO | 2007/119343 A1 | 10/2007 |
| WO | 2008/041380 A1 | 4/2008 |

OTHER PUBLICATIONS

Japanese Office Action issued in corresponding Application No. 2009-038808 dated Nov. 13, 2012.

International Search Report issued in corresponding International Application No. PCT/JP2009/070963 dated Dec. 21, 2010.

Written Opinion of the International Preliminary Examining Authority issued in corresponding International Application No. PCT/JP2009/070963 dated Mar. 23, 2010.

Chinese Office Action dated Jan. 23, 2014, with English language translation, for corresponding Chinese Patent Application No. 200980156808.6.

* cited by examiner

MANUFACTURING METHOD OF LIQUID-COOLED JACKET

CROSS-REFERENCE TO RELATED APPLICATIONS

This is a continuation application of U.S. patent application Ser. No. 13/148,955, filed on Aug. 11, 2011, which is a 371 application of International Patent Application No. PCT/JP2009/070963 filed Dec. 16, 2009, which claims foreign priority benefit of Japanese Patent Application No. 2009-038808, filed on Feb. 23, 2009. The subject matter of the prior applications is hereby incorporated by reference.

TECHNICAL FIELD

This invention relates to a manufacturing method of liquid-cooled jacket, which is configured to fix a seal body in an opening of a recess of jacket body by friction stir welding.

BACKGROUND ART

The friction stir welding (FSW: Friction Stir Welding) has been known as a method for joining together metallic components. The friction stir welding is designed to rotate and move a rotary tool along a butting portion of metallic components, force the metal at the butting portion to make in plastic flow resulted from the friction heat between the rotary tool and the metallic component, and join together in solid phase between the metallic components.

In recent years, as electronic devices, for example, personal computers have been developed in performance, calorific value of CPU (heat generating body) boarded therein has been increasing in amount. Then, it has been becoming important to cool down the CPU. Conventionally, although a heat sink typed of air cooling fan has been used to cool down the CPU, problems such as noises caused by fan and cooling limits by air cooling have been gathering attention. Thus, the liquid-cooled jacket has been gathering attention as a next-generation cooling system.

In such a liquid-cooled jacket, an art for joining together between constituent components by the friction stir welding has been disclosed in Japanese Patent Unexamined Laid-open publication No. 324,647 of 2006. The liquid-cooled jacket is, for example, provided with a jacket body having a fin housing for metallic fins and a seal body for the fin housing. Then, it is configured to manufacture the liquid-cooled jacket by the friction stir welding by going round the rotary tool along a butting portion between a peripheral wall of the jacket body surrounding the fin housing and a circumferential surface of the seal body. The seal body is formed to be thinner compared with the jacket body and put on a supporting surface comprising of a bottom surface of a step portion formed in the jacket body. The rotary tool is moved along the butting portion in order to place its center on the butting portion. Then, the jacket body and the seal body are mutually joined together.

As above mentioned, in case where the thin-walled seal body is put on a supporting surface of the jacket body to join together the butting portion by the friction stir welding, it has a problem that the seal body is curved and warped by thermal contraction and expansion owing to the friction stir occurred on a surface of the jacket body.

In order to solve the above problems, an art for emitting a water jet by a cooling nozzle at a place of the friction stir welding and pressing the butting portion by a roller after the friction stir welding has been disclosed in Japanese Patent Unexamined Laid-open Publication No. 87,871 of 2001.

SUMMARY OF THE INVENTION

Problem to be Solved by the Invention

In an invention relating to this publication (Japanese Patent Unexamined Laid-open Publication No. 87,871 of 2001), it might steep water in the friction stir welding device and have a bad influence on drive system or the like, because water is emitted in the place at the friction stir welding. It has a problem that water is scattered in the surrounding by a rotation of the rotary tool and the water management becomes troublesome owing to water jet at the joint place.

In such a viewpoint, the present invention is an object to provide a manufacturing method of liquid-cooled jacket, by which a deformation of the seal body can be easily reduced.

Means Solving the Problem

As a means for solving the above problem, this invention is constituted that a manufacturing method of liquid-cooled jacket configured to fix a seal body for sealing an opening of a recess in a jacket body making heat transport fluid transporting heat generated by heat generating body to flow to the outside and having a recess in accordance with the friction stir welding. Furthermore, this invention comprises a step putting the seal body on a supporting surface formed in a peripheral portion of opening of the recess of the jacket body and composing of a step portion bottom surface placed to be lower from a surface of the jacket body and a step of confronting the seal body with a step portion side surface of the jacket body. Still more, this invention comprises a step forming a plasticized region by going round the rotary tool having a stir pin with its size having a larger length than a thickness of the seal body along the butting portion between the step portion side surface of the jacket body and the circumferential surface of the seal body, and joining together the seal body in the jacket body.

In this method, as a stir pin of the rotary tool is inserted from the supporting surface in the jacket body, the plasticized region is formed in a deep portion of the jacket body. Then, the stress caused by thermal contraction of the plasticized region can be dissipated in the jacket body to prevent a deformation of the seal body.

The present invention is characterized in that a width of the supporting surface is larger than a radius of a shoulder of the rotary tool.

In such a method, when the rotary tool moves at a top of the butting portion, the plasticized region can be formed in the supporting surface to securely support an indentation force of the rotary tool at the supporting surface.

The present invention is characterized in that the recess is provided with a ridge having a same surface as the supporting surface therein and the method comprises forming a plasticized region by moving the rotary tool along the ridge on a surface of the seal body and joining together the seal body to the ridge.

In such a method, as the jacket body and the seal body are mutually joined together at the ridge having a same surface as the supporting surface inside the recess, even if the recess is large in area, a deformation of the seal body can be effectively prevented.

The present invention is characterized in that a width of the ridge is larger than a diameter of the shoulder of the rotary tool.

In this method, as the plasticized region is formed in the ridge, when the rotary tool moves at a top of the ridge, the indentation force can be securely supported on the ridge.

The present invention is characterized in that the method comprises a step attaching a cooling plate circulating a cooling medium to an opposite surface to a surface performing the friction stir welding of the jacket body, and a step moving the rotary tool, while cooling down the jacket body.

In this method, as heat generated by the friction stir welding is absorbed by the cooling plate, thermal contraction in the plasticized region can be reduced and a deformation of the seal body can be effectively prevented.

The present invention is characterized in that a cooling channel circulating the cooling medium of the cooling plate is, at least, provided with a plane shape forming along a moving locus of the rotary tool.

In this method, as heat generated by the friction stir welding can be effectively absorbed in the proximity of the generated place, a deformation of the seal body can be effectively prevented.

The present invention is characterized in that the cooling channel circulating the cooling medium of the cooling plate is configured by a cooling tube embedded in the cooling plate.

In this method, it is easy to provide a cooling channel, in which the cooling medium is easy to circulate without leak.

The present invention is characterized in that it comprises a step performing the friction stir welding by moving the rotary tool while the recess, as the opening is sealed by the seal body, is circulated therein and the jacket body and the seal body is cooled down.

In this method, as heat generated by friction stir welding can be absorbed by the cooling medium without a cooling plate, thermal contraction in the plasticized region can be made small, a deformation of the seal body can be effectively prevented, and manufacturing step can be simplified.

The present invention is characterized in that the method comprises a step turning the rotary tool in a clockwise direction, when the rotary tool moves in a clockwise direction around the opening and a step turning the rotary tool in a counterclockwise direction, when the rotary tool moves in a counterclockwise direction around the opening.

In this method, even if there is a cavity defect, it takes place at a position being outer from the butting portion and spacing far from a channel of heat transport fluid. Therefore, the heat transport fluid is hard to leak outside from the channel, and it has no bad influence on a sealing performance of the butting portion.

The present invention is characterized in that it comprises a step restirring an outer side of the plasticized region by shifting the rotary tool to the outside of the plasticized region formed at the time of making one round after making one round the rotary tool along the butting portion, and going one more round the rotary tool along the butting portion.

In this method, even if the cavity defect occurs on first round, the cavity defect can be reduced by stirring and moving on a second round. Even if the cavity defect occurs on a second round, it occurs at the portion spaced far from the butting portion between the peripheral edge of an opening of the jacket body and the peripheral edge of the seal body. Accordingly, the heat transport fluid is hard to leak outside and it can greatly improve a sealing performance of the butting portion.

The present invention is characterized in that it comprises a step joining together temporarily a part of the butting portion with use of the rotary tool for temporary joint being smaller in size than the rotary tool, prior to a step forming the plasticized region with use of the rotary tool.

In this method, the seal body never moves, it is easy to joint, and a positioning accuracy of the seal body improves at the time of friction stir welding (hereinafter, it may be referred to as "formal joint") by temporary joint between the jacket body and the seal body. As the rotary tool for temporary joint is smaller in size than the rotary tool for formal joint, the formal joint can be completed by moving the rotary tool for the formal joint on the temporary joint portion and performing the formal joint.

The present invention is characterized in that the butting portion forms like a rectangular frame. In a step for temporarily joining the butting portion with use of the rotary tool for temporary joint, after one diagonal elements of the butting portion is temporarily joined together, the other diagonal elements of the butting portion is temporarily joined together.

The present invention is characterized in that the butting portion forms like a rectangular frame. In a step for temporarily joining together the butting portion with use of the rotary tool for temporary joint, after intermediate portions in one opposite sides of the butting portions are temporarily joined together, intermediate portions in the other opposite sides of the butting portions are temporarily joined together.

In this method, the seal body can be temporarily joined together in good balance and the positioning accuracy relative to the jacket body of the seal body greatly improves.

Effect of the Invention

The present invention has an excellent effect to easily control a deformation of the seal body.

EMBODIMENT FOR CARRYING OUT THE INVENTION

First Embodiment

In a first embodiment of the present invention, it will be described in detail with reference to the drawings.

At first, a liquid-cooled jacket formed by a manufacturing method of liquid-cooled jacket in accordance with the present invention will be described. The liquid-cooled jacket is, for example, a constituent component of a cooling system in an electronic device such as a personal computer to be parts cooling down CPU (heat generator) or the like. The liquid cooling system is mainly provided with a liquid-cooled jacket attached to the CPU at a predetermined position, a radiator (radiating means) irradiating heat transmitted by a cooling water (heat transport fluid) to the outside, a micro-pump (heat transport fluid supply means) circulating the cooling water, a reserve tank absorbing expansion/contraction of the cooling water based on a change of temperature, a flexible tube connecting thereto, and the cooling water for transmitting heat. The cooling water is a heat transport fluid transmitting heat generated in the CPU as heat generator, as not shown, to the outside. As the cooling water, an anti-freezing solution of ethylene glycol is, for example, used. When the micro-pump actuates, the cooling water is designed to circulate through these devices.

Figure 1:
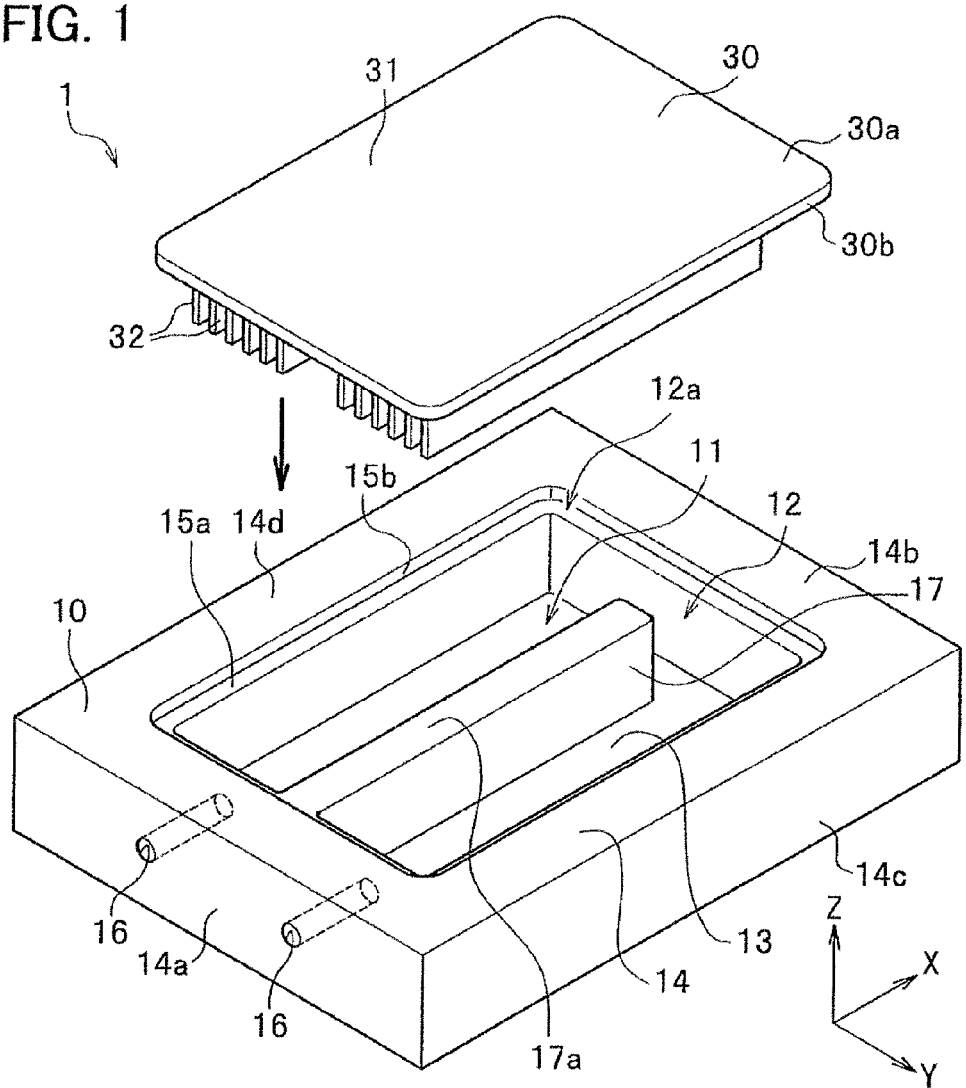
FIG. 1 is an exploded perspective view showing a liquid-cooled jacket in accordance with a first embodiment of the present invention.

As shown in FIG. 1, the liquid-cooled jacket 1 is configured to circulate the cooling water (as not shown) therethrough and to fix the seal body 30 sealing an opening 12 of a recess 11 to a jacket body 10 having a recess 11 with a part thereof opened with use of a friction stir welding (See FIG. 5A to FIG. 7B).

The liquid-cooled jacket 1 is designed to provide CPU (as not shown) through a thermal diffusion sheet (as not shown) in a middle of the lower side thereof to receive heat generated by the CPU and heat exchange the cooling water circulating therethrough. Then, the liquid-cooled jacket 1 transmits heat received from the CPU to the cooling water, thus to effectively cool down the CPU. In addition, the thermal diffusion sheet is a sheet for effectively transmitting heat generated in the CPU to the jacket body 10. For example, it is made of metal having high performance in conductivity such as copper.

The jacket body 10 is a shallow box with one side thereof (an upper side in FIG. 1 of this embodiment) opened and forms like a rectangle as seen from top in this embodiment. The jacket body 10 is provided with the recess 11 with its top opened therein, and includes a bottom wall 13 of the recess 11 and a peripheral wall 14. Such jacket body 10 is made by, for example, dye cast, casting, forging, or the like. The jacket body 10 is made of aluminum or aluminum alloy. Thus, a lightweight of the liquid-cooled jacket 11 can be obtained and then it is easy to handle it.

An opening 12 of the recess 11 of the jacket body 10 forms like a substantially rectangle with four corners chamfered in arc-shaped forms. An opening edge 12a of the recess 11 of the jacket body 10 is provided with a supporting surface 15a made by a step portion bottom surface lowered to the bottom side of the recess 11. In this embodiment, although a ridge 17 is formed inside the recess 11, an opening 12 of the recess 11 is described to show a substantially rectangle to regard the ridge 17 as a part of the recess 11. The opening peripheral edge 12a of the recess 11 is considered as a peripheral edge of the recess 11 including the ridge 17.

Figure 3A:
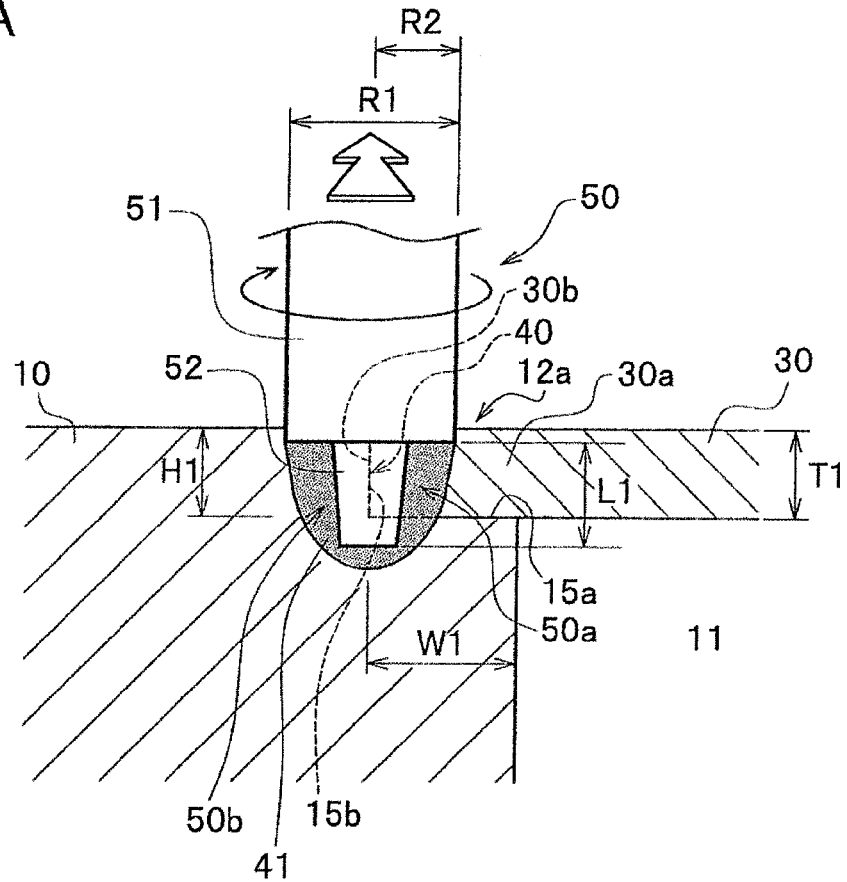
FIG. 3A is a sectional view showing a step for friction stir welding on a first round.

As shown in FIG. 3A, an elevation difference H1 between an upper surface of the jacket body 10 and a supporting surface 15a is a same length as a thickness T1 of the seal body 30. The supporting surface 15a is a surface for supporting the seal body 30 and a peripheral edge 30a of the seal body 30 is put on the supporting surface 15a. A width W1 of the supporting surface 15a (a width of portion for putting a peripheral edge 30a of the seal body 30) is set to be larger than a radius R2 of the shoulder 51 of a so-called rotary tool 50 used in the friction stir welding.

As shown in FIG. 1, the peripheral wall 14 surrounding the recess 11 is constituted by a pair of walls 14a, 14b positioning at both ends in a longitudinal direction of the jacket body 10 (X-axis direction in FIG. 1), and a pair of walls 14c, 14d positioning at both ends in a lateral (short-side) direction thereof (Y-axis direction in FIG. 1). The pair of walls 14a, 14b are configured to extend in Y-axis direction, space a predetermined distance in X-axis direction, and arrange mutually in parallel. The pair of walls 14c, 14d are also configured to extend in X-axis direction, space a predetermined distance in Y-axis direction, and then arrange mutually in parallel.

The recess 11 is provided with a ridge 17 therein. The ridge 17 is constituted by a wall body standing from a bottom wall 13 of the recess 11. A height from the bottom wall 13 of the ridge 17 is a same height as a height standing from the bottom wall 13 of the supporting surface 15a. That is, an upper surface 17a of the ridge 17 (a surface of the ridge 17) is a same surface with the supporting surface 15a formed in an open circumferential edge 12a. The ridge 17 extends in X-axis direction from a center of a portion in Y-axis direction of an inner wall surface of one wall 14a (inner circumferential wall side surface of the recess 11) toward the other wall 14b between the pair of walls 14a, 14b. A tip in an extending direction (X-axis direction) of the ridge 17 spaces a predetermined distance with an inner wall surface (inner circumferential side surface of the recess 11) of the wall 14b. It is provided with a space for flowing cooling fluid between a tip of the ridge 17 and an inner wall surface of the wall 14b. Namely, it is provided with a groove (substantially hollow portion) in a U-shape letter form as seen from top to form the ridge 17 inside the recess 11. Then, it is designed to flow cooling fluid along this U-shape letter. The wall 14a positioned at both ends of a channel in U-shape letter as seen from top is respectively provided with through holes 16, 16 for flowing cooling water in the recess 11. The through holes 16, 16 extend in X-axis direction in this embodiment, and are formed to have a circular section in a middle portion of depth direction of the recess 11. Forms, numbers, and positions of the through hole 16 are not limited to these, and they are appropriately changeable according to kinds and flow rate of the cooling water.

Figure 2:
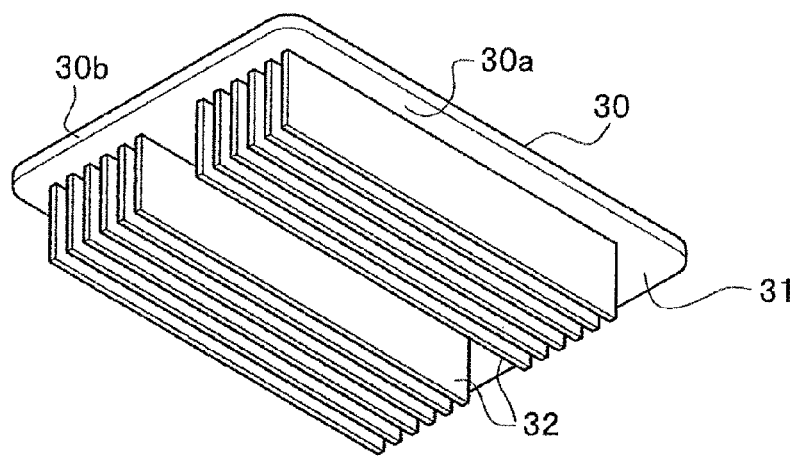
FIG. 2 is a perspective view showing from oblique lower of the seal body of the liquid-cooled jacket in accordance with the first embodiment of the present invention.

As shown in FIGS. 1 and 2, the seal body 30 is provided with a lid plate portion 31 with an outer form having a same form (substantially rectangle chamfered in an arc-shaped form at four corners in this embodiment) as the step side surface 15b (Refer to FIG. 1) of the jacket body 10, and a plurality of fins 32, 32, . . . provided under a surface of the lid plate portion 31.

The fin 32 is provided in order to make large a surface area of the seal body 30. The plurality of fins 32, 32, . . . are designed to mutually arrange in parallel and cross the lid plate portion 31. Then, the fins are integrally constituted with the lid plate portion 31. Accordingly, it is designed to preferably transmit heat among the lid plate portion 31 and the fins 32, 32, . . . . As shown in FIG. 1, the fins 32, 32, . . . are arranged to extend in a direction (X-axis direction in FIG. 1), in which the through holes 16, 16, ... cross the wall 14a of the peripheral wall 14 forming the through holes 16, 16, .... As the ridge 17 is positioned in a center of Y-axis direction of the lid plate portion 31 at the time of setting to the jacket body 10, the fins are not provided. The fin 32 has a same deep size (depth) (length in a Z-axis direction in FIG. 1) as a depth of the recess 11, so that the tip keeps in contact with a bottom surface of the recess 11 (a surface of the bottom wall 13). Accordingly, a tubular space is separated by the lid plate portion 31 of the seal body 30 and the neighboring fins 32, 32 in a condition that the seal body 30 is attached to the jacket body 10. Then, this space is functioned as a channel 33 (See FIG. 5A) making a flow of the cooling water.

The fins 32, 32 ... have a shorter in length (length in X-axis direction in FIG. 1) than an extension of the ridge 17. One ends of the fins (side of the wall 14a) are respectively configured to separate an inner wall surface of the wall 14a in a predetermined interval. The space between one ends of these fins 32, 32, ... and the wall 14a are constituted a channel header 34 (See FIG. 5A) connecting a channel 33 separated by the fins 32, 32 and the through hole 16. The other ends of the fins 32, 32, ... (side of the wall 14b) are positioned at a portion equivalent to a tip of the ridge 17. The space among the other ends of the fins 32, 32, ..., a tip of the ridge 17, and the wall 14b are designed to constitute a communication channel 35 (See FIG. 5A) connecting between the channels 33, 33 positioned at both sides of the ridge 17.

The seal body 30 as well as the jacket body 10 is formed by aluminum or aluminum alloy. Thus, a weight saving of the liquid-cooled jacket 1 can be obtained to easily handle. The lid plate portion 31 and the fin 32 of the seal body 30 are manufactured by cutting a block formed of aluminum or aluminum alloy. The manufacturing method is not limited to this, and it may be manufactured by, for example, dye casting, casting, forging, or the like. It may be manufactured by the extrusion molding or grooving of components with a sectional form composed of the lid plate portion 31 and a plurality of the fins 32, 32, ... and by eliminating both ends of the fin 32.

Next, a method for fixing the seal body 30 in the jacket body 10 by the friction stir welding will be described with reference to FIGS. 3A to 7B.

Figure 5A:
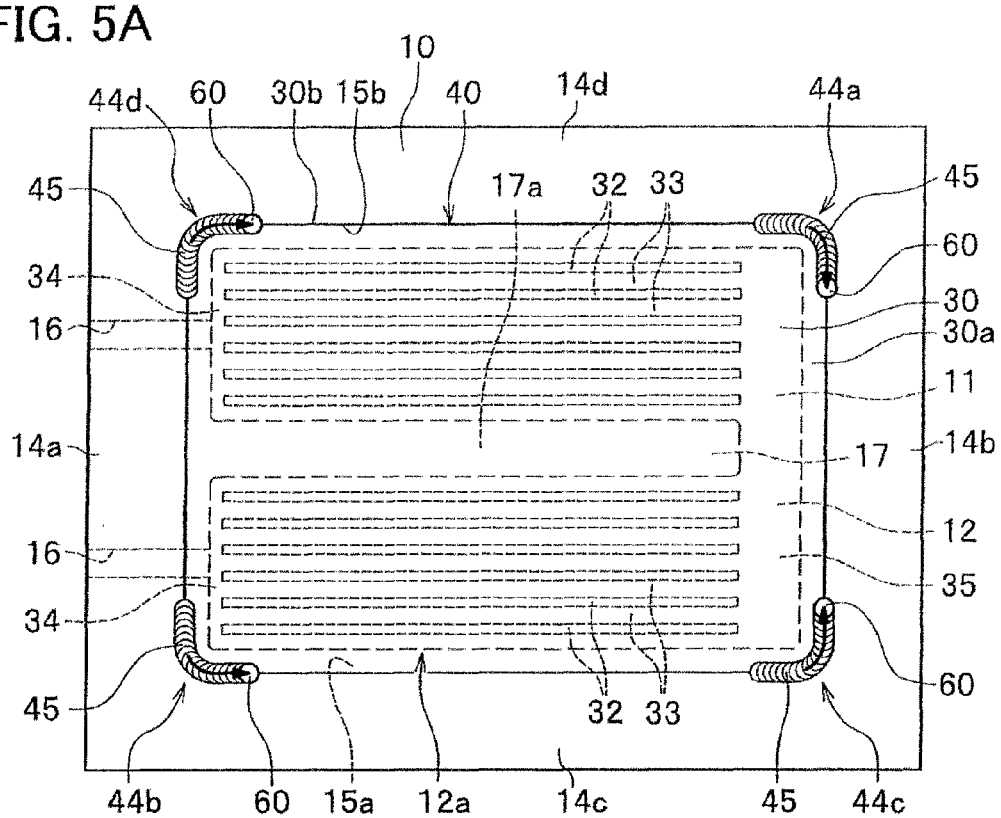
FIG. 5A is a plan view showing a step for temporary joint.

As shown in FIG. 5A, the seal body 30 is inserted into the recess 11 of the jacket body 10 to place the fan 32 in a lower side, and put the circumferential edge 30a of the seal body 30 on the supporting surface 15a. Then, the step side surface 15b of the jacket body 10 and the outer circumferential surface 30b of the seal body 30 are mutually confronted to constitute a butting portion 40.

Figure 3B:
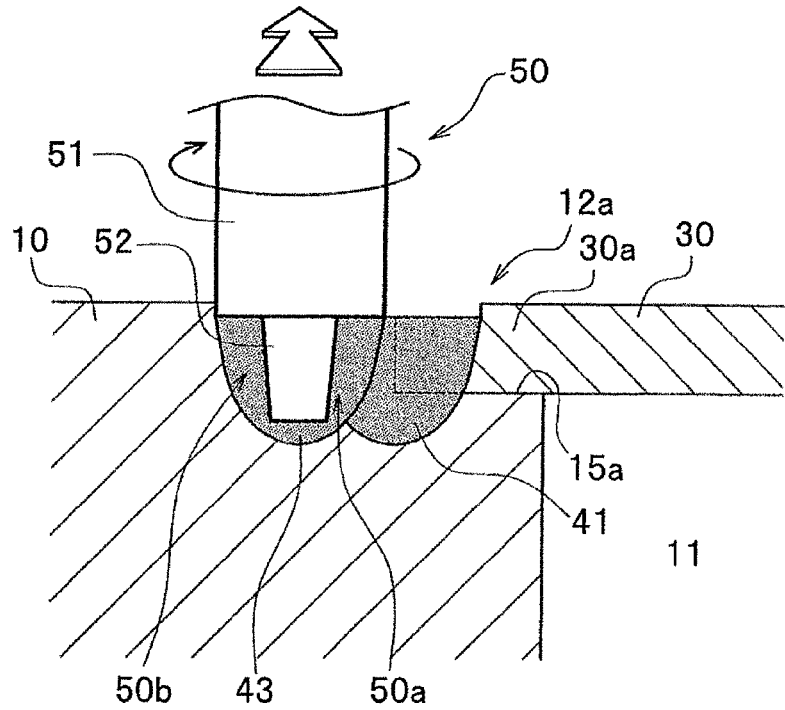
FIG. 3B is a sectional view showing a step for friction stir welding on a second round in accordance with the first embodiment of the present invention.

In this embodiment, a part of the butting portion between the jacket body 10 and the seal body 30 is temporarily joined together with use of a small rotary tool 60 (showing only a plane form in FIG. 5A) for temporary joint as being smaller than the rotary tool 50, prior to a step (forming the plasticized region 41) performing a formal joint by the rotary tool 50 as shown in FIGS. 3A and 3B.

The rotary tool for temporary joint 60 is provided with a smaller shoulder in diameter than the rotary tool 50 and the stir pin (as not shown). The plasticized region 45 manufactured by the rotary tool for temporary joint 60 has a smaller width than a width of the plasticized region 41 (See FIG. 5B) manufactured by the rotary tool 50 in the following step. The plasticized region 45 is formed at a position as not jutted out (a position in which a center in width of the plasticized region 45 is set as the butting portion in this embodiment) from a position forming the plasticized region 41 in the following step. Then, as the plasticized region 45 at the temporary joint is completely covered with the plasticized region 41, traces drawn by the rotary tool for temporary joint 60 stayed in the plasticized region 45 and traces of the plasticized region 45 are not left behind.

In this embodiment, the butting portion 40 forms like substantially a rectangle (rectangular frame) with four corners chamfered in a circle. In a step for temporarily joining together the butting portion 40 by the rotary tool for temporary joint 60, after previously and temporarily joining together the opposite angles 44a, 44b chamfered at one butting portion 40 are temporarily joined together, opposite angles 44c, 44d chamfered at the other butting portion 40 are temporarily joined together. By temporarily joining together in such order, the seal body 30 can be temporarily joined together to the jacket body 10 in a good balance. Then, a positioning accuracy relative to the jacket body 10 of the seal body 30 improves, and a deformation of the seal body 30 can be effectively prevented. After the temporary joint performed at each opposite angle 44a, 44b, 44c, or 44d, when the rotary tool for temporary joint 60 is drawn, traces drawn 61 (See FIG. 5B) remains. It is left in this embodiment.

Figure 5B:
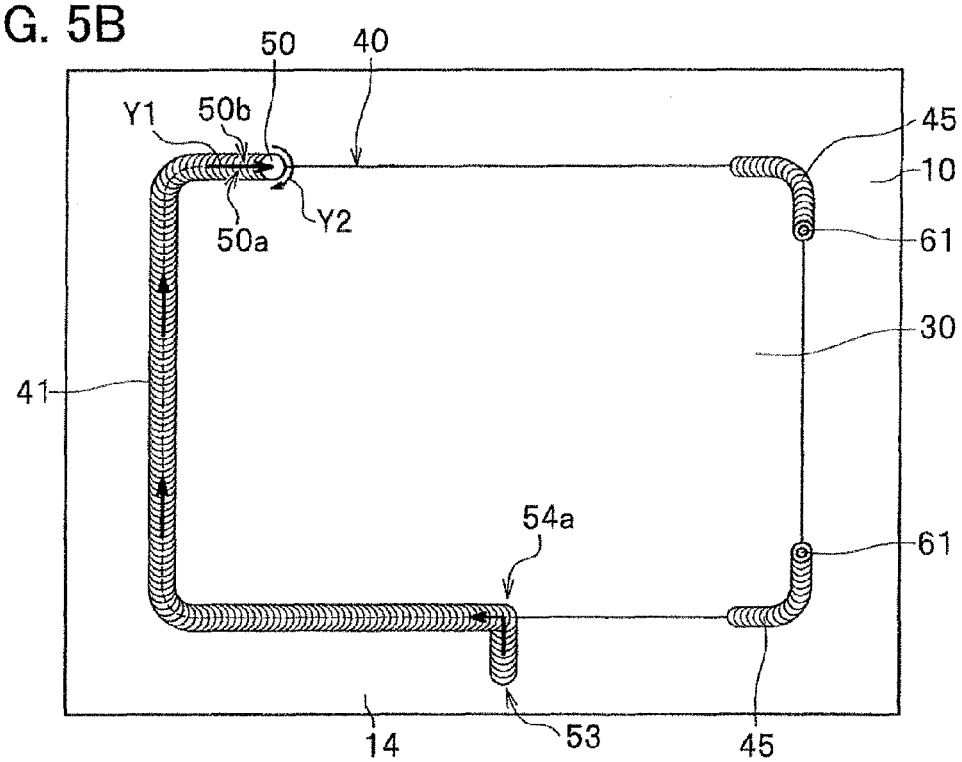
FIG. 5B is a plan view showing a step for formal joint in accordance with the first embodiment of the present invention.

Next, the formal joint is performed by the rotary tool 50. In this step, as shown in FIG. 5B, after the rotary tool 50 for friction stir welding is inserted rotating in the insert position 53, it is moved on the butting portion 40 and moved along the butting portion 40. At this time, it is preferable to previously apply a tool (as not shown) surrounding the jacket body 10 from four directions on an outer circumferential surface of the peripheral wall 14 of the jacket body 10. In this case, even if a thickness of the peripheral wall 14 is thin and a distance (gap) between an outer circumferential surface of the shoulder 51 of the rotary tool 50 (See FIG. 3A) and an outer circumferential surface of the peripheral wall 14 is, for example, 2.0 mm or less, the peripheral wall 14 is hard to deform by an indentation force of the rotary tool 50. In case where a thickness of the peripheral wall 14 is thick, the above tool may not be installed.

The rotary tool 50 is made of hard metallic material than the jacket body 10 and the seal body 30. As shown in FIG. 3A, it is provided with the shoulder 51 having a cylinder and a stir pin (probe) 52 provided under a lower edge surface of this shoulder 51. The size and form of the rotary tool 50 are designated according to material, thickness, or the like of the jacket body 10 and the seal body 30. In this embodiment, the stir pin 52 forms like a crucible former with its lower reduced diameter, and the extension L1 is a thickness T1 or more of the lid plate portion 31 of the seal body 30. Then, at the time of friction stir welding, a tip of the shoulder 51 of the rotary tool 50 is intruded from a surface of the jacket body 10 and the seal body 30 in a predetermined depth and a tip of the stir pin 52 is pierced through the supporting surface 15a. A radius R2 of the shoulder 51 is smaller than a width H1 of the supporting surface 15a. The rotation speed of the rotary tool 50 is 500 to 15000 (rpm), the feed speed is 0.05 to 2 (m/min), and the indentation force pressing the butting portion 40 is approximately 1 to 20 (kN). They are appropriately selected according to a material, plate thickness, and form of the jacket body 10 and the seal body 30.

Hereinafter, a movement of the rotary tool 50 will be specifically described. At first, the rotary tool 50 is inserted, rotating into the insert position 53. The insert position 53 of the rotary tool 50 is positioned to be an upper surface of the peripheral wall 14 strayed off from the butting portion 40 to the outside as shown in FIG. 5B. A prepared hole (as not shown) may be previously provided in the insert position 53 of the rotary tool 50. In this way, the insert time (intruding time) of the rotary tool 50 can be reduced.

The rotary tool 50 is, thereafter, moved rotating to an overhead position (position on which an axis of the rotary tool 50 is over the butting portion 40) of the butting portion 40 from the insert position 53. When the rotary tool 50 moves to an overhead position of the butting portion 40, the rotary tool 50 is moved by changing its moving direction such that a center (axis) of the rotary tool 50 moves along the butting portion 40. In this time, the rotary tool 50 is moved, rotating in order to place the seal body 30 in a flow side rotating the rotary tool 50 in an opposite direction of the moving direction of the rotary tool 50 (See an Arrow Y1 in FIGS. 5B and 6A). Specifically, a rotational direction (self-rotation direction) of the rotary tool 50 at the butting portion 40 is arranged in a same direction as the moving direction (revolutional direction). Namely, in this embodiment, as shown in FIG. 5B, as the rotary tool 50 is moved to rotate in a clockwise direction relative to the opening 12 of the recess 11 (See FIG. 5A), the rotary tool 50 is rotated in a clockwise direction (See an Arrow Y2 in FIGS. 5B and 6A). In addition, when the rotary tool 50 moves in a counterclockwise direction relative to the opening 12 of the recess 11, the rotary tool 50 rotates in a counterclockwise direction.

In this way, as the relative speed in an outer circumference of the rotary tool 50 relative to the seal body 30 amounts to a reduced value (seal body 30 is equal to the flow side 50a) of a magnitude of the moving speed from a magnitude of tangential speed at an outer circumference of the rotary tool 50, the speed becomes low compared with a shear side 50b rotating the rotary tool 50 in a same direction as a moving direction of the rotary tool 50. Accordingly, a cavity defect is hard to occur in the side of the seal body 30. As the shear side 50b is located in the thick-wall portion of the jacket body 10 positioning closer to an outside of the butting portion 40, a metal deficiency never occurs.

As shown in FIG. 3A, the stir pin 52 of the rotary tool 50 is so constituted that as the length L1 is longer than the thickness T1 of the seal body 30, a tip of the stir pin 52 goes through the supporting surface 15a and inserts deeply into the jacket body 10. Thus, a tip (lower end) of the plasticized region 41 formed by the rotary tool 50 is formed by deeply intruding in the deep side of the jacket body 10. Herein, "plasticized region" contains both a plastic condition by heating based on a friction heat of the rotary tool 50 and a condition returned to normal temperature by passing through the rotary tool 50.

In succession, when the rotary tool 50 continues to rotate and move, the plasticized region 41 is formed, by which the rotary tool 50 makes one round along the butting portion 40 around the opening 12. When the rotary tool 50 has made one round, the rotary tool 50 moves by a predetermined length along an initiating edge including one-round initiating edge 54a (a portion ranging (from the initiating edge 54a to the advanced position (a same position as the terminating edge 54b) as a predetermined distance toward a moving direction of the rotary tool 50). The initiating edge 54a and the terminating edge 54b in a circumference direction of the rotary tool 50 are mutually overlapped. Then, a part of the plasticized region 41 comes to overlap.

Figure 6A:
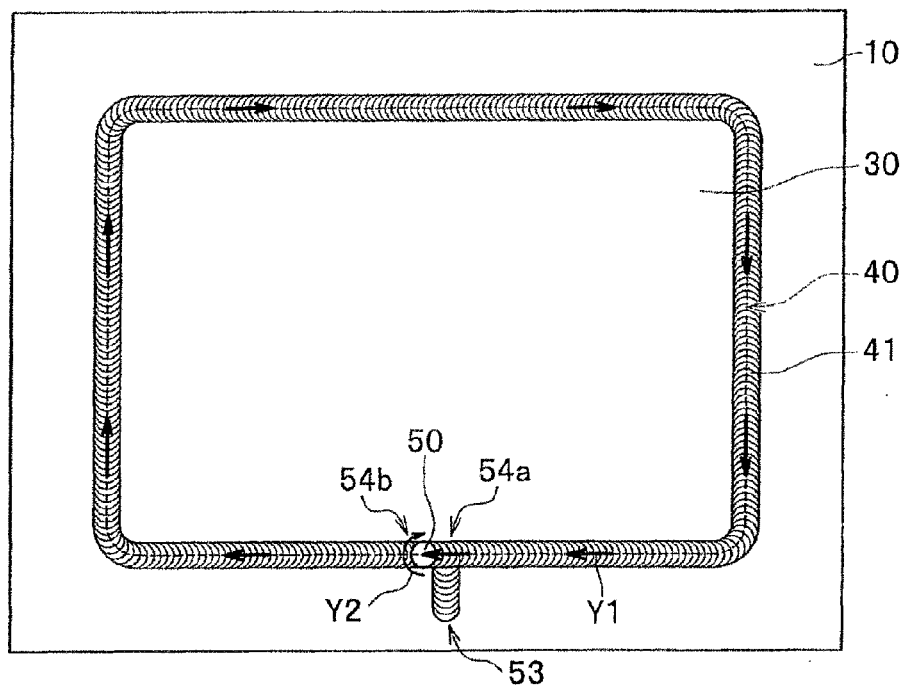
FIGS. 6A and 6B are views for explaining a step for friction stir of the manufacturing method of liquid-cooled jacket in accordance with the first embodiment of the present invention, and a plan view showing a step for friction stir (step for formal joint) following in FIGS. 5A and 5B.
Figure 6B:
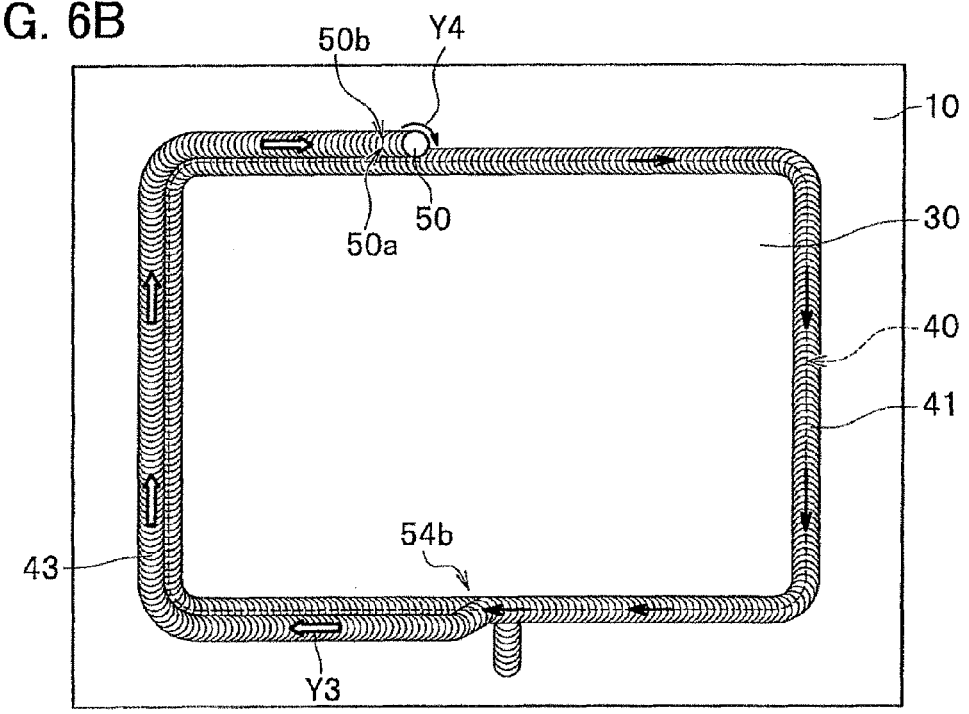

As shown in FIG. 6B, after the rotary tool 50 has terminated a movement of first one round, the plasticized region 43 (hereinafter referred to as "second plasticized region") is formed by one more round of the rotary tool 50. At second one round, the rotary tool 50 shifts outside the plasticized region 41 formed by moving at one round from a terminating edge 54b at the first one round.

In this case, a shift of the rotary tool 50 moves oblique to shift outside as it advances toward a moving direction and an inner side edge of moving locus (plasticized region 43) of second one round of the rotary tool 50 is placed on a center line (butting portion 40) of one round moving locus (plasticized region 41) or slightly outside the center line. Thereafter, the rotary tool 50 moves in parallel, keeping a constant relationship with one round moving locus (plasticized region 41) as shown in FIG. 6B. Accordingly, an outer circumference portion of the one round moving locus is restirred by moving second one round of the rotary tool 50. (See FIGS. 6A to 7B). Then, even if cavity defect occurs in an outer circumference of the plasticized region 41 in the shear side 50b of the rotary tool 50, the cavity defects can be canceled by restirring.

As the shear side 50b of the rotary tool 50 at the second-round movement is positioned in a thick-wall portion of the jacket body 10 placed closer to the outside of the butting portion, the metal deficiency never occurs. Even if the cavity deficiency occurs, there is no problem as it occurs at a position spaced far from the butting portion 40. The second-round movement of the rotary tool 50 is the same as rotation direction, rotation speed, moving direction, moving speed, and intruding volume at one-round movement. (See arrows Y3, Y4 in FIGS. 6B and 7A). In addition, the rotation speed, the moving speed, the intruding volume, or the like of the rotary tool 50 at the second-round movement may be appropriately changeable according to a form and a quality of material of the jacket body 10 and the seal body 30.

As shown in FIG. 3B, the stir pin 52 of the rotary tool 50 is so constituted that a tip of the stir pin 52 is deeply intruded into the jacket body 10, as a length L1 (See FIG. 3A) is larger than a thickness T1 (See FIG. 3A) of the seal body 30. Accordingly, a tip (lower portion) of a second plasticized region 43 formed by the second-round movement of the rotary tool 50 is formed to deeply intrude inside the jacket body 10.

As shown in FIG. 6A, when the rotary tool 50 terminates a circumferential movement of the rotary tool 50, the rotary tool 50 is designed to move toward an upper surface of the peripheral wall 14 strayed off from the plasticized region 43 to the outside and draw the rotary tool 50 at this position (drawn position 55). In this way, as the drawn position 55 of the rotary tool 50 is positioned to be strayed off to the outside from the butting portion 40, the trace drawn (as not shown) of the stir pin 52 (See FIG. 4A) is not formed in the butting portion 40. Thus, the joint property between the joint property 10 and the seal body 30 can improve. In addition, the trace drawn on an upper surface of the peripheral wall 14 may be repaired by machining such as burying welding metal in the ground.

Figure 7A:
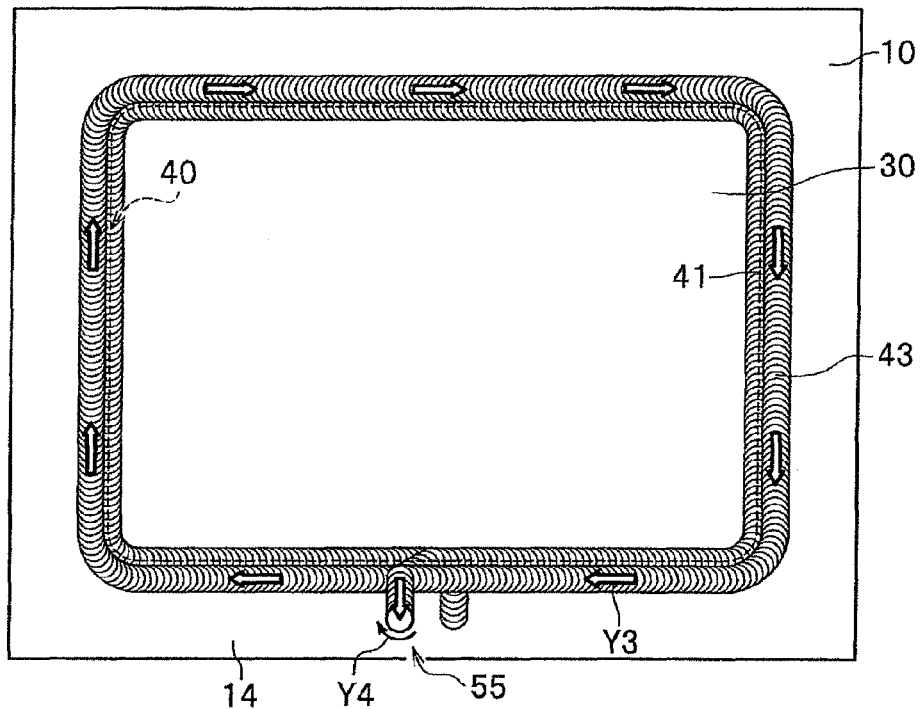
FIGS. 7A and 7B are views for explaining a step for friction stir of the manufacturing method of liquid-cooled jacket in accordance with the first embodiment of the present invention, and a plan view showing a step for friction stir following in FIGS. 6A and 6B.
Figure 7B:
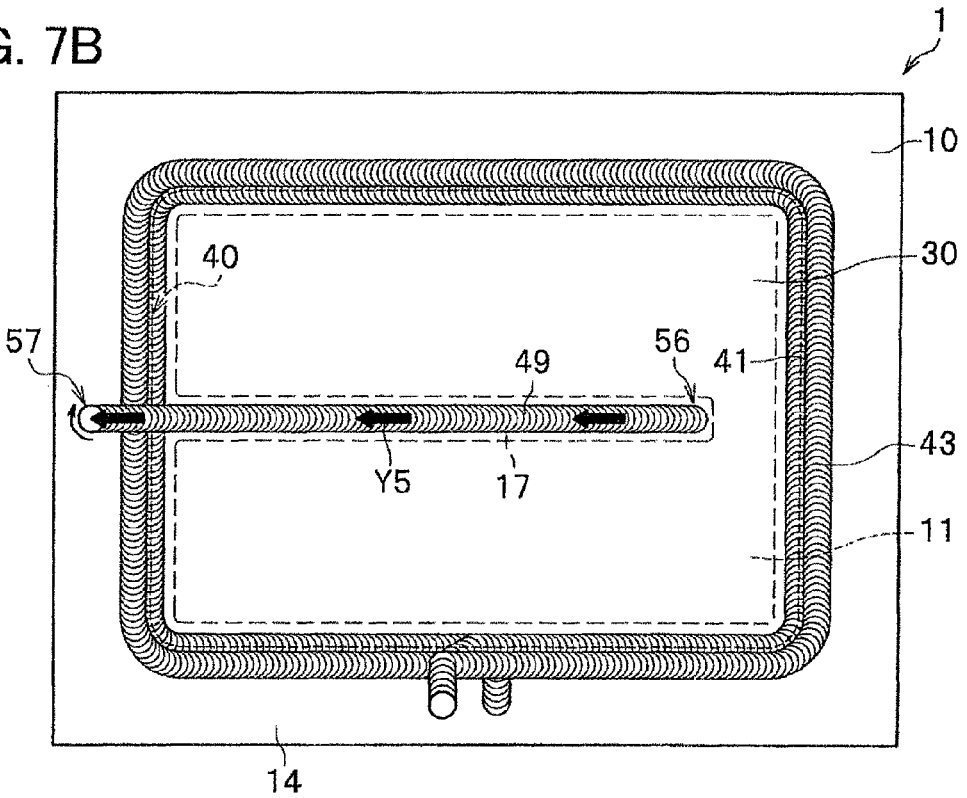

Thereafter, the ridge 17 and the seal body 30 are joined together by the friction stir welding with use of the above rotary tool 50. As shown in FIG. 7B, this is designed to insert, rotating the rotary tool 50 at the insert position 56 of a tip of the ridge 17. A prepared hole (as not shown) may be previously provided in the insert position 56 of the rotary tool 50. In this way, the insert time of the rotary tool 50 can be reduced.

The plasticized region 49 is formed by directing the rotary tool 50 from the insert position 56 to the outside of the butting portion 40 and moving rotating it along the ridge 17. When the rotary tool 50 moves and the friction stir welding is performed until an inner circumferential end of the plasticized region 41, the rotary tool 50 is intruded in the plasticized region 41 and moved from the plasticized region 41 to the second plasticized region 43. Thereafter, the rotary tool 50 is moved from an outer circumferential edge of the second plasticized region 43 to an upper surface of the peripheral wall 14 strayed off to the outside. Then, the rotary tool 50 is drawn away at the place (drawing position 57). In this way, as the drawing position 57 of the rotary tool 50 is positioned to be strayed off to the outside from the butting portion 40, the trace drawn (as not shown) of the stir pin 52 (See FIG. 4A) is not formed in the butting portion 40. Thus, the joint property between the jacket body 10 and the seal body 30 can be improved and enhanced. The drawing mark placed on an upper surface of the peripheral wall 14 may be repaired by machining such as burying welding metal in the ground.

As above mentioned, the rotary tool 50 moves linearly (See an Arrow Y5 in FIG. 7B) along the ridge 17 from the insert position 56 to the drawn position 57. In this time, rotating direction (self-rotation direction), rotation speed, moving direction (revolution direction), moving direction, and intruding volume are constant. In addition, the rotation direction may be either counterclockwise rotation or clockwise rotation.

Figure 4:
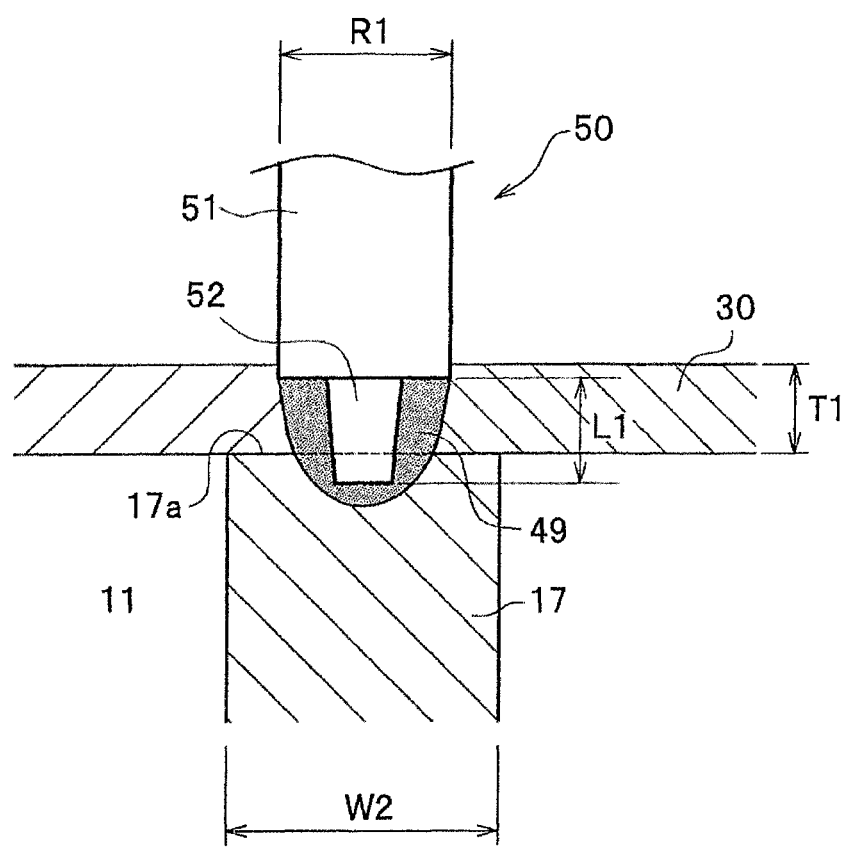
FIG. 4 is a view for explaining a manufacturing method of liquid-cooled jacket in accordance with a first embodiment of the present invention, and a sectional view showing a step for friction stir welding at a ridge.

As shown in FIG. 4, the stir pin 52 of the rotary tool 50 is so constituted that as a length L1 is longer than a thickness T1 of the seal body 30, a tip of the stir pin 52 goes through a surface 17a of the ridge 17 and intrudes deeply inside the jacket body 10 (inside the ridge 17). Accordingly, the tip (lower end) in the plasticized region 49 made by the rotary tool 50 is formed to be deeply intruded inside the jacket body 10.

As above described, the plasticized region 41 and the second plasticized region 43 are formed by making two rounds the rotary tool 50 along the butting portion 40 around the opening 12 of the recess 11. Furthermore, after the plasticized region 49 is formed by moving the rotary tool 50 along the ridge 17 and performing the friction stir welding and then the seal body 30 is fixed in the jacket body 10, the liquid-cooled jacket 1 is made by removing burrs as generated in friction stirring.

In the manufacturing method of the liquid-cooled jacket 1 in accordance with this embodiment and the friction stir welding method, as the friction stir welding is performed with use of the rotary tool 50 providing the stir pin 52, of which a length L1 is longer than a thickness T1 of the seal body 30, tips of the plasticized region 41, 43, and 46 are formed to deeply intrude in the depth of the jacket body 10. Thus, the stress caused by heat contraction of the plasticized region 41, 43, and 46 can be dissipated in the jacket body 10. As the jacket body 10 becomes fewer in deformation on receiving the stress because of the thick wall and fewer in stress transmitting to the seal body 30, a deformation of the seal body 30 can be reduced.

As a width W1 of the supporting surface 15a is larger than a radius R2 of the shoulder 51 of the rotary tool 50, the plasticized region 41 can be formed in the supporting surface 15a when the rotary tool 50 moves to an overhead position of the butting portion 40 at one-round movement of the rotary tool 50. In this way, as the plasticized region 41 is not exposed in an inner surface of the recess 11, the indentation force of the rotary tool 50 can be securely supported at the supporting surface 15a without making lower the supporting surface 15a in the side of the bottom wall 13 of the recess 11. Accordingly, as the seal body 30 is supported at the supporting surface 15a, the seal body 30 is not deformed without intruding the rotary tool 50 in a lower side.

The recess 11 is provided with the ridge 17, which is the same surface as the supporting surface 15a. The seal body 30 is supported in a plane surface on the surface 17a of the supporting surface 15a and the ridge 17, even in case of a large surface area in the recess 11 by forming the plasticized region 49 along the ridge 17 and joining together the seal body 30 in the ridge 17. In this way, a plane property of the seal body 30 can be maintained and a deformation of the seal body 30 can be reduced. Even if a deformation of the seal body 30 occurs at the friction stir welding around the opening 12 of the jacket body 10, a deformation of the seal body 30 can be reduced by joining together the seal body 30 and the ridge 17 in the following step.

As a width W2 of the ridge 17 is larger than a diameter R1 of the shoulder 51 of the rotary tool 50, the plasticized region 49 can be formed in the surface 17a of the ridge 15 when the rotary tool 50 moves to an overhead position of the ridge 17. Accordingly, as the plasticized region 49 is not exposed in a side of the ridge 17, an indentation force of the rotary tool 50 can be securely supported at the ridge 17 without making lower the surface 17a of the ridge 17 in the side of the bottom wall 13 of the recess 11. Thus, the seal body 30 is supported on the surface 17a of the ridge 17, there is no deformation without applying an indentation force of the rotary tool 50.

In this embodiment, as the rotary tool 50 is moved in a clockwise direction and rotated in a clockwise direction relative to the opening 12, the thin-wall seal body 30 becomes a flow side 50a and the cavity defect is hard to occur in a side of the seal body 30. Although the jacket body 10 is placed in a side of the shear side 50b, as the jacket body 10 is formed like a thick wall, the metal deficiency does not occur even in case of the rapid relative speed in a circumference of the rotary tool 50 relative to the jacket body 10. Thus, the cavity deficiency caused by the metal deficiency at the butting portion can be effectively prevented and a deterioration of the joint strength of the butting portion 40 can be effectively prevented. Even if the cavity deficiency occurs, it occurs at a portion spaced far from the butting portion 40 to the outside and at a position spaced far from the channel of the heat transport fluid. Accordingly, the heat transport fluid is hard to leak from the channel to the outside, and it has not had a bad influence on a sealing performance of the butting portion.

Even if the cavity deficiency occurs at first one-round movement of the rotary tool 50 in this embodiment, the cavity deficiency can be cancelled by restirring a portion, which positions in the shear side 50b at the first one-round movement, at the time of second one-round movement of the rotary tool 50.

In this embodiment, as a part of the butting portion 40 is temporarily joined together with use of the rotary tool for temporary joint 60 prior to a formation of the plasticized region 41 by the rotary tool 50, it is easy to join together without moving the seal body 30 at the time of friction stir welding by the rotary tool 50 and a positioning accuracy relative to the jacket body 10 of the seal body 30 improves. As the rotary tool for temporary joint 60 is smaller than the rotary tool for formal joint 50, trace drawn of the plasticized region 45 and the rotary tool 60 are covered by the friction stirring by moving on the plasticized region 45 formed by the temporary joint. Then, the formal joint has been completed.

The butting portion 40 is formed like a rectangular frame. In a step for temporarily joining together the butting portion 40 by the rotary tool for temporary joint 60, after one diagonal elements 44a, 44b of the butting portion 40 are temporarily joined together, the other diagonal elements 44c, 44d are temporarily joined together. Then, the seal body 30 can be temporarily joined together in a good balance and a positional accuracy relative to the jacket body 10 of the seal body 30 further improves.

In this embodiment, an initiating end 54a and a terminating end 54b moving in a circumferential direction of the rotary tool 50 are partially overlapped in the plasticized region 41.

Then, the plasticized region 41 has no portion for disconnecting a opening circumferential edge 12a of the recess 11. Accordingly, as the peripheral wall 14 of the jacket body 10 and the seal body 30 can be well joined together and the heat transport fluid does not leak to the outside, a seal property in the joint portion can improve.

Second Embodiment

Next, a manufacturing method of liquid-cooled jacket in accordance with the second embodiment will be described with reference to FIG. 8.

Figure 8A:
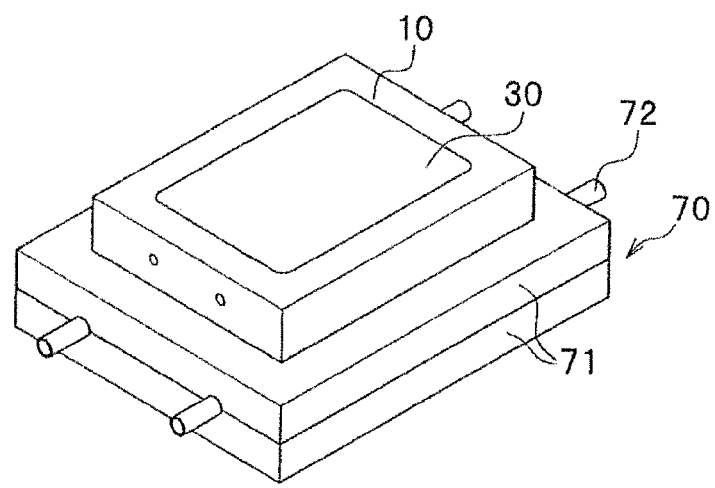
FIG. 8A is a condition in use.

As shown in FIG. 8A, this embodiment is characterized in that, in a step for forming the plasticized regions 41, 53, and 49 with use of the rotary tool 50 in accordance with the first embodiment, the cooling plate 70 circulating the cooling medium therethrough is provided on an opposite surface of a surface performing the friction stir welding (a surface opening the recess 11) of the jacket body 10, and the friction stir welding is performed by moving the rotary tool 50 (See FIGS. 3A and 3B) cooling down the jacket body 10.

Figure 8B:
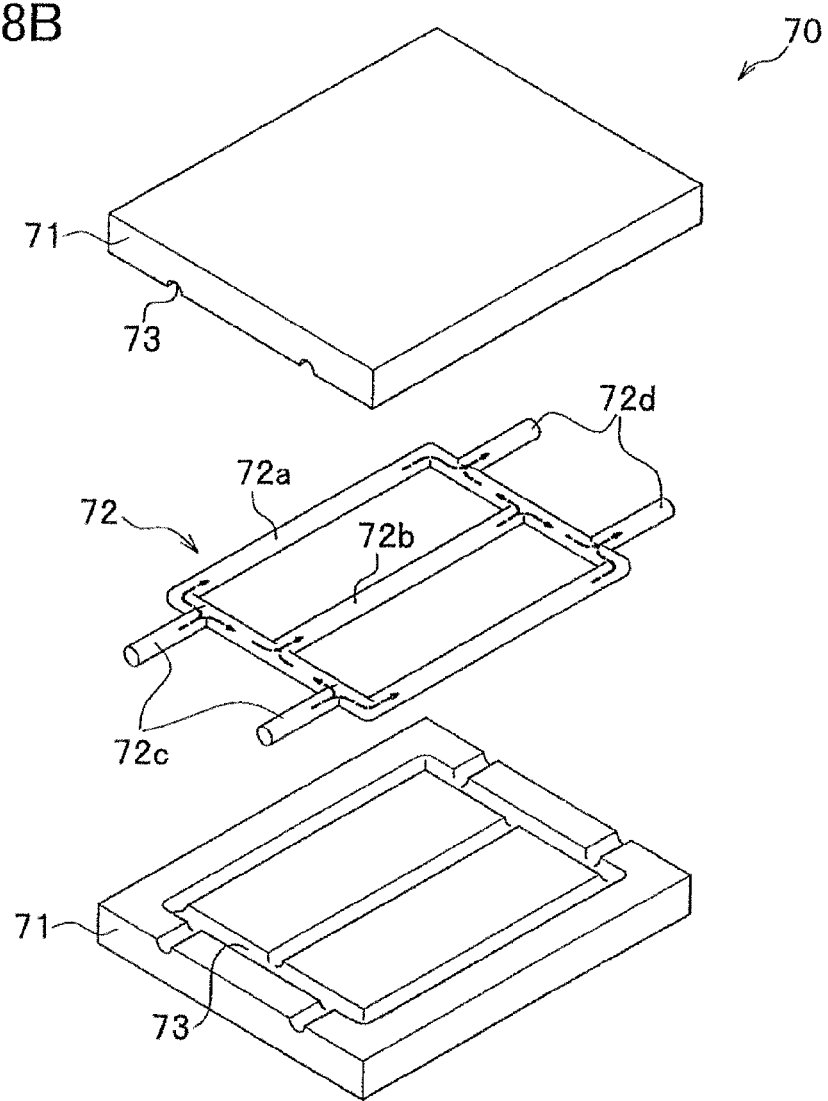
FIG. 8B is a perspective view showing an exploded perspective view in accordance with a second embodiment of the present invention.

The cooling plate 70 is configured to provide the cooling tube 72 composing of the cooling channel therein, as shown in FIG. 8B. Specifically, the cooling plate 70 is configured by fixing to pinch the cooling tube 72 with a pair of cooling plate bodies 71, 71. The cooling tube 72 has a plane form formed along a moving locus of the rotary tool 50 to provide an outer circumference 72a formed along the plasticized region 41 and the second plasticized region 43, an intermediate portion 72b formed along the plasticized region 49 of the ridge 17, an inlet portion 72c flowing the cooling medium in, and an outlet portion 72d flowing the cooling medium out. The cooling tube 72 is made, for example, by a cylindrical copper tube to integrally form the outer circumference 72a, the intermediate portion 72b, the inlet portion 72c, and the outlet portion 72d.

The cooling plate proper 71, 71 are made of aluminum or aluminum alloy. The cooling plate proper 71, 71 are configured to form a plane symmetrical form at an upper and lower positions each other, and form a channel 73 for housing the cooling tube 72 in an inner side (a side of the cooling tube 72). The channel 73 forms like a semi-circular form in section and is designed to keep in close contact between the inner circumferential surface of the channel 73 and the outer circumferential surface of the cooling tube 72 by pinching the cooling tube 72 with use of the cooling plate proper 71, 71. The channel 73 is, for example, formed by cutting work or the like on a surface of the cooling plate proper 71. The cooling plate proper 71, 71 are, for example, joined together by an adhesive having good thermal conductivity. The joint between the cooling plate proper 71, 71 is not limited to the adhesive and may be the other method such as welding or friction stir welding.

After the jacket body 10 as the seal body 30 attached is fixed to an upper portion of the cooling plate 70 in such a constitution, the friction stir welding is performed by flowing the cooling medium through the cooling tube 72.

Based on such a manufacturing method of liquid-cooled jacket, the heat generated in the friction stir welding can be effectively absorbed by the cooling plate 70. Thus, the thermal contraction in the plasticized region can be effectively reduced and a deformation of warp, deflection or the like of the seal body 30 can be effectively reduced.

In this embodiment, as the cooling channel (cooling tube 72) is provided with, at least, a plane form along the moving locus of the rotary tool 50, the heat generated in the friction stir welding can be effectively and uniformly absorbed at a position near the generated position and a deformation of the seal body 30 can be effectively reduced. Furthermore, as the cooling channel is constituted by the cooling tube 72 buried in the cooling plate 70, it is easy to make a cooling channel, which is easy to flow and hard to leak. Still moreover, as the cooling plate 70 makes the joint portion to cool down the joining portion without providing a jet of water by a nozzle at the joint portion in a conventional method, it is easy to manage and control the water (cooling medium).

Although the jacket body 10 and the seal body 30 are cooled down by flowing the cooling medium in the cooling plate 70 in this embodiment, this is not limited thereto. For example, the friction stir welding may be performed by flowing the cooling medium in the recess 11 sealing the opening 12 by the seal body 30, while the jacket body 10 and the seal body 30 are cooled down.

As the heat in the friction stir welding can be absorbed in this way by the cooling medium without the cooling plate 70, the thermal contraction in the plasticized regions 41, 43, and 49 can be reduced and a deformation of the seal body 30 can be reduced, and a step for cutting work can be simplified.

Third Embodiment

Next, a manufacturing method of the liquid-cooled jacket in accordance with a third embodiment and a method of the friction stir welding will be described with reference to FIGS. 9A and 9B.

Figure 9A:
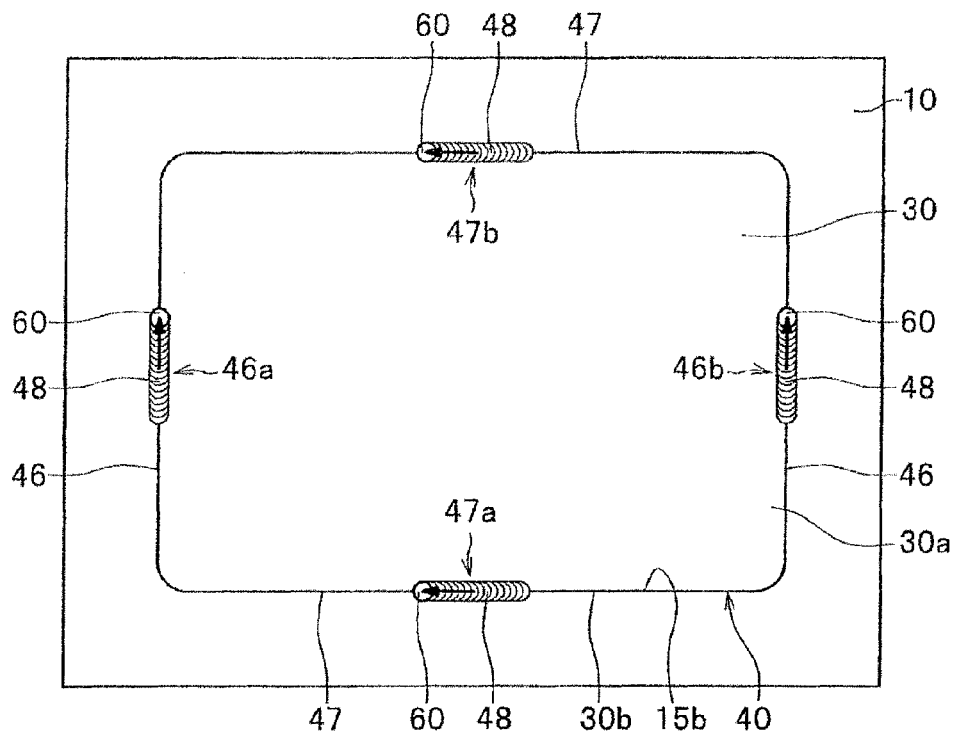
FIG. 9A is a plan view showing a step for temporary joint.
Figure 9B:
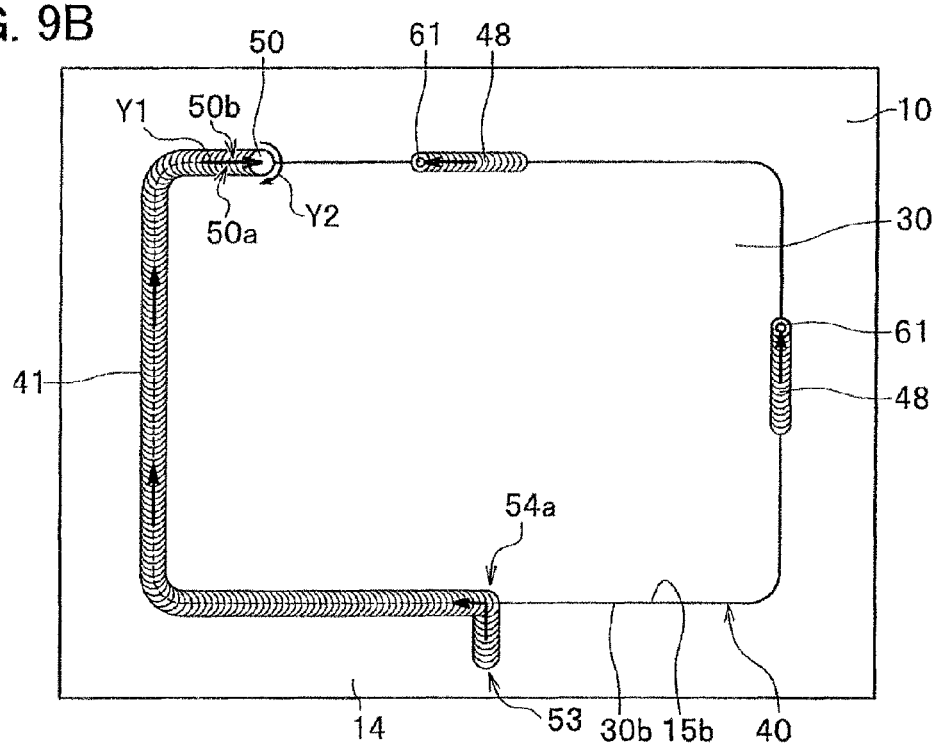
FIG. 9B is a plan view showing a step for formal joint in accordance with a third embodiment of the present invention.

As shown in FIG. 9A, this embodiment is characterized in that a part of the butting portion 40 between the jacket body 10 and the seal body 30 is temporarily joined together with use of a small rotary tool for temporary joint than the rotary tool 50 prior to a step for forming the plasticized region 41 with the rotary tool 50 relating to the first embodiment. Temporary joint in this first embodiment is linearly performed by the friction stir welding at an intermediate portion of each side, although the friction stir welding is performed at a corner of the rectangular butting portion 40 in the first embodiment. More specifically, the butting portion 40 is formed like substantially a rectangle (a form of rectangular frame). In a step for temporarily joining together the butting portion 40 by the rotary tool for temporary joint 60, after the temporary joint is performed between the intermediate portions 46a, 46b of one opposite sides 46, 46 of the butting portion 40, the temporary joint is performed between the intermediate portions 47a, 47b of the other opposite sides 47, 47. In this time, the plasticized region 48 formed by the rotary tool for temporary joint 60 is, respectively, linearly formed such that its length is the same or equal each other. As shown in FIG. 9B, the plasticized region 48 is formed not to stray away from a position forming the plasticized region 41 at the following step. As a step of the formal joint forming the plasticized regions 41, 43, and 49 by the rotary tool 50 is the same configuration as one of the first embodiment, the explanation will be omitted.

In this embodiment, the seal body 30 can be temporarily joined together to the jacket body 10 in good balance by performing the temporary joint like the above order. Then, a positioning accuracy relative to the jacket body 10 of the seal body 30 improves and a deformation of the seal body 30 can be prevented. A gap or shift out of place of the seal body 30 can be effectively prevented at the time of formal joint of the rotary tool 50 by performing the temporary joint of the seal body 30. In this embodiment, as the friction stir welding of the temporary joint is linear, it is easy to work or machine only by linearly moving the rotary tool for temporary joint 60.

As above described, although embodiments of this invention have been described, the embodiment of this invention is not limited to this and it may be appropriately changeable without departing from the gist or essence of this invention. For example, although the seal body 30 is substantially a rectangle as seen from top in the above embodiment, this is not limited to this form and may be the other form such as a square, a polygon, and a circle. The fin 32 provided in the seal body 30 may be a separate body from a lid plate portion. For example, it may be separately provided to house in the recess 11 and it may be integrally provided with the jacket body.

Although the ridge 17 is provided at one portion to extend from one wall portion 14a to the other wall portion 14b in each embodiment, this is not limited to this and a lot of ridges may be provided. In this case, a lot of ridges may be provided to extend from one wall portion to the other wall portion, and the ridge may be provided with at least one every a pair of wall portions facing each other, and a serpentine channel for flowing or circulating cooling water may be configured.

We claim:

1. A manufacturing method of liquid-cooled jacket, the method comprising:
    putting a seal body on a supporting surface formed in an opening circumferential edge of a recess in a jacket body, the supporting surface being lower than an upper surface of the jacket body, the jacket body being capable of circulating a heat transport fluid for transmitting heat generated in a heat generating body to an outside area, and confronting a step side surface of the jacket body with an outer circumferential surface of the seal body;
    attaching a cooling plate having a flowing cooling medium inside, on a lower surface of the jacket body, the lower surface being opposite to the upper surface of the jacket body;
    joining together the seal body to the jacket body by the friction stir welding, wherein a rotary tool with a stir pin being larger than a thickness of the seal body moves in a clockwise or counterclockwise direction along a butting portion between the step side surface of the jacket body and the outer circumferential surface of the seal body to form a continuous plasticized region around the seal body, while cooling down the jacket body and the seal body by the cooling plate having the flowing cooling medium inside, wherein a width of the supporting surface is larger than a radius of a shoulder of the rotary tool,
    wherein the rotary tool moves in a clockwise direction around the opening while turning the rotary tool in a clockwise direction, and the rotary tool moves in a counterclockwise direction around the opening while turning the rotary tool in a counterclockwise direction.

2. The manufacturing method of liquid-cooled jacket according to claim 1, wherein a cooling channel flowing the cooling medium of the cooling plate is, at least, provided with a plane form formed along a moving locus of the rotary tool.

3. The manufacturing method of liquid-cooled jacket according to claim 1, wherein a cooling channel flowing the cooling medium through the cooling plate is configured by a cooling tube embedded in the cooling plate.

4. The manufacturing method of liquid-cooled jacket according to claim 1, wherein the method further comprises:
    flowing the cooling medium inside the recess as the opening is sealed by the seal body,
    wherein the joining of the friction stir welding by moving the rotary tool occurs while cooling down the jacket body and the seal body.

5. The manufacturing method of liquid-cooled jacket according to claim 1, wherein the method further comprises:
    shifting the rotary tool to an outer circumference of the plasticized region formed after having made one round with the rotary tool along the butting portion between the step side surface of the jacket body and the outer circumferential surface of the seal body; and
    moving the rotary tool along the butting portion a second time to restir in the outer circumference of the plasticized region.

6. The manufacturing method of liquid-cooled jacket according to claim 1, wherein the method further comprises:
    joining together temporarily a part of the butting portion between the step side surface of the jacket body and the outer circumferential surface of the seal body with use of another rotary tool for temporary joint, which is smaller than the rotary tool, prior to forming the plasticized region by the rotary tool.

7. The manufacturing method of liquid-cooled jacket according to claim 6, wherein the joining together temporarily of the butting portion between the step side surface of the jacket body and the outer circumferential surface of the seal body, the butting portion being formed in the shape of a rectangular frame, with use of the rotary tool for temporary joint, after one set of diagonal elements of the butting portion has been temporarily joined together, other set of diagonal elements of the butting portion is temporarily joined together.

8. The manufacturing method of liquid-cooled jacket according to claim 6, wherein joining together temporarily of the butting portion between the step side surface of the jacket body and the outer circumferential surface of the seal body, the butting portion being formed in the shape of a rectangular frame, with use of the rotary tool for temporary joint, after intermediate portions in one opposite sides of the butting portions have been temporarily joined together, intermediate portions in other opposite sides of the butting portions are temporarily joined together.

* * * * *